Nov. 21, 1967 E. K. HOWELL 3,354,312

PHASE CONTROL CIRCUITS FOR LIGHT ACTIVATED SWITCHES
USING A VARIABLE RESISTOR WITH AN A.C. VOLTAGE
ACROSS IT AS THE PHASE CONTROL
Filed March 27, 1964

INVENTOR:
EDWARD K. HOWELL,
BY Urban H. Faubion
HIS ATTORNEY.

3,354,312

PHASE CONTROL CIRCUITS FOR LIGHT ACTIVATED SWITCHES USING A VARIABLE RESISTOR WITH AN A.C. VOLTAGE ACROSS IT AS THE PHASE CONTROL

Edward K. Howell, Skaneateles, N.Y., assignor to General Electric Company, a corporation of New York Filed Mar. 27, 1964, Ser. No. 355,201
19 Claims. (Cl. 250—206)

ABSTRACT OF THE DISCLOSURE

Phase control firing of a light activated switch is provided by connecting the switch between voltage source terminals and providing a circuit including a firing light source (firing for the light activated switch) and means to control the voltage applied to the firing light source in parallel with the light activated switch across the source terminals whereby illumination of the lamp is caused by the voltage applied across the light activated switch. That portion of the voltage so applied is adjusted to determine the intensity of the light source and, therefore, the point of firing of the light activated switch. Once fired, the resistance of the light activated switch is so low as to constitute essentially a short circuit whereby voltage across the firing light source is reduced essentially to zero and the circuit is reset for the next applied voltage pulse.

This invention relates to circuits which provide phase-control firing of light activated switches and circuits which provide control of power applied to a load from a source of pulsating voltage by control of the firing angle (relative to applied voltage pulses) of light activated switches.

A light activated switch is a switch which can be rendered conductive (triggered on) with incident light energy, the level of which is greater than the switch threshold level. Once turned on, the switch remains conductive until the current applied through its terminals is reduced beyond a holding level. Other devices may be used but the circuits illustrated employ silicon PNPN switches.

Where the terms light and radiation are used for convenience, radiant energy is usually meant. Where a silicon PNPN switch is used, the terms light and radiation contemplate radiant energy within the spectral band width of silicon. Where the term pulsating voltage is used it refers to a voltage, the level of which rises and falls in a pulse-like manner. For example, the term is used to include sinusoidal alternating voltages and full and half-wave rectified alternating voltages.

The light activated switch is inherently an on-off device which has broad industrial application but which has not generally been considered useful in phase-control applications. The present invention is directed to the provision of simple, inexpensive and reliable phase-control circuits using light activated switches. Such circuits are particularly useful for controlling heating elements (e.g. for soldering iron) and for lamp dimming arrangements.

In carrying out the invention, phase-control firing for light activated switches is provided by subjecting the light activated switch to a source of radiation which is energized by a pulsating voltage and provides control of the time required for the radiant energy source to produce radiant energy greater than the threshold level for firing the light activated switch.

The features which are believed to be characteristic of the invention are set forth with particularity in the appended claims. The invention itself, however, both as to its organization and advantages thereof may best be understood by reference to the following description taken in connection with the accompanying drawings in which:

Figure 1:
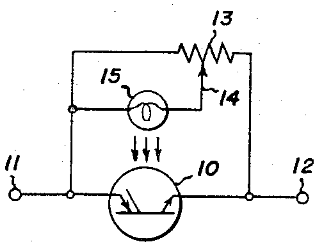
FIGURE 1 is a circuit diagram illustrating a preferred arrangement for light activated phase-control circuits.

In FIGURE 1 a circuit which is a basic phase control for light activated switches is shown. The heart of the system is, of course, a light activated switch 10 having anode and cathode terminals 11 and 12 respectively. For convenience, the anode and cathode terminals 11 and 12 may also be considered the circuit source terminals since they are intended to be connected to a source of pulsating voltage.

The light activated switch 10 illustrated is a silicon PNPN switch which has the desirable characteristics of small size, high power capability, completely static operation, about one microsecond response time, ruggedness, long life, and complete electrical isolation between input and output. The extremely rapid switching time of the light activated switch makes good phase-control possible. Light activated switch 10 is triggered "on" by incident radiant energy impinging upon the silicon active area. Light activated switches, for example, types L6, L7, L8 and L9 manufactured by the General Electric Company, are sensitive to incident radiant energy within the spectral bandwidth of silicon. This bandwidth includes invisible ultraviolet and infrared electromagnetic radiation as well as radiation perceptible by the human eye. The term "light" in light activated switch is used in a non-technical manner to indicate radiant energy to which the light activated switch is sensitive.

A light source 15 is positioned adjacent light activated switch 10 so that light emanating therefrom will impinge upon the active surface. Light source 15 may be a low voltage, extremely rugged, long life incandescent lamp, such as General Electric miniature type 2128. This particular lamp has a small low-mass filament with a short delay time compared with most lamps. The short delay time of the lamp is another highly desirable feature for phase-control firing of a light activated switch.

When the radiant energy of lamp 15 impinging upon the silicon active area of light activated switch 10 is above the threshold light level, the switch 10 fires. In order to provide a means to control the time required for the lamp to reach the threshold level (time after application of pulsating source voltage to the lamp), a variable resistor or rheostat 13 having a movable tap 14 is provided. The rheostat 13 provides a way to vary the magnitude of the current through the lamp 15. In this arrangement, the rheostat 13 is connected with its full resistance in parallel with light activated switch 10 and lamp 15 is connected between anode terminal 11 and movable tap 14 on the rheostat 13. In this arrangement, the total resistance of the rheostat 13 should be large (e.g. 10,000 ohms) in comparison to the resistance of lamp 15 so that it, in effect, acts as a current source for the lamp 15 rather than a voltage source.

With movable tap 14 at the end of resistance 13 nearest the potential of anode terminal 11 (toward the left end in the figure) no current is applied to the lamp and it produces no illumination. With movable tap 14 at the opposite end of the resistor, the full voltage drop across the lamp is in a relatively low resistance path between source terminals (anode and cathode terminals) 11 and 12. For this condition, the lamp radiates with essentially full intensity at a relatively low voltage. For the low current through the lamp with tap 14 near the anode end of the resistor the light intensity is too low to fire the light activated switch. With the tap 14 at the opposite end of rheostat 13 current builds up in the lamp 15 very rapidly and there is enough light to fire the light activated switch very soon after voltage is applied. For tap 14 at intermediate positions the time required to reach the threshold light level depends upon the magnitude of the resistance in series with the lamp 15 and lamp properties. With tap 14 very near the anode terminal end of rheostat 13 three to five pulses of applied pulsating voltage is required to bring the lamp light intensity to threshold level for the light activated switch. This time is reduced to about one millisecond when the tap 14 is at the opposite end of rheostat 13. When the light activated switch 10 is fired it bypasses or shorts lamp 15 and thus resets the circuit after each firing, and prevents further increase in lamp current.

From this description it is seen that the circuit of FIGURE 1 provides phase-control firing of the light activated switch and can be used in combination with various loads to provide phase control of energization. It will be appreciated that other means and arrangements may be used to control intensity of the light source.

Figure 2:
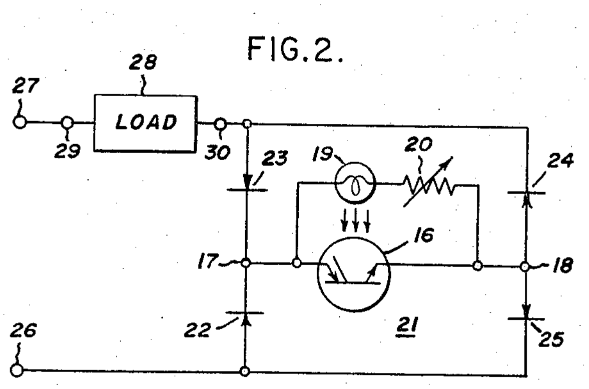
FIGURE 2 is a circuit diagram showing a complete circuit for providing full wave phase control of voltage applied to a load.

A circuit where a phase controlled light activated switch 16 is used to control both half cycles of an alternating current voltage is illustrated in FIGURE 2. Here, the phase control firing of light activated switch 16 is provided by connecting the series connected combination of a lamp 19 and variable resistance (rheostat) 20 directly between anode and cathode terminals 17 and 18 of the light activated switch 16. The lamp 19 and light activated switch 16 may again be the same types as discussed above and the rheostat 20 may be variable from zero to 50,000 ohms.

The firing principle is the same as discussed for the circuit of FIGURE 1. The anode and cathode terminals 17 and 18 may again be considered source terminals since they supply the pulsating voltage to the phase control circuit. In this case the source terminals 17 and 18 are also the output terminals for a full wave bridge rectifier 21. Therefore, the pulsating voltage applied to the light activated switch 16 is both half cycles of a rectified alternating wave supplied between input terminals 26 and 27.

The full wave bridge 21 is conventional and is made up of four half wave rectifiers 22, 23, 24 and 25. The input terminals for the bridge 21 are at the juncture between upper rectifiers 23 and 24 (upper in the figure) and at the juncture between lower rectifiers 22 and 25. The lower bridge input terminal is connected directly to alternating source terminal 26 and the upper bridge terminal is connected in series with load terminals 29 and 30 to the other alternating voltage source terminal 27. Since the light activated switch 16 is effectively in series circuit relation with the load 28 for both half-cycles of the alternating source and is phase-control fired, an effective phase control for the load 28 is provided.

With the value of the variable resistor 20 very small, the light intensity of lamp 19 builds up beyond threshold level for light activated switch 16 very rapidly for both half cycles from the alternating source. Thus, light activated switch 16 provides a low resistance (essentially a short circuit) path in series with load 28 for almost all of each half-cycle. As a consequence, essentially full supply voltage is applied across the load 28 (both half-cycles). As resistance 20 is increased to full value, the condition is reached where current through the lamp 19 is too low to produce the radiant energy for triggering light activated switch 16. For this condition, essentially no load current flows. For intermediate values of resistance 20, the time required to reach the threshold light level depends upon the magnitude of resistance 20 and the characteristics of lamp 19. Thus, the angle (phase or period) of conduction of each half-cycle of applied voltage depends upon these factors.

Figure 3:
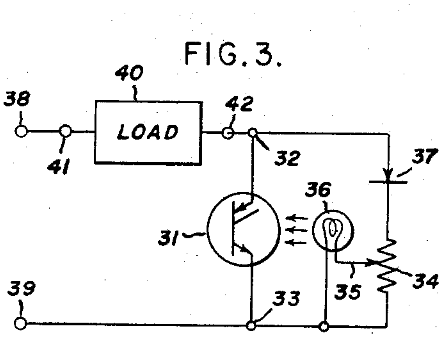
FIGURE 3 is a circuit diagram of a half-wave control including a feature to extend the life of the radiation source.

A half-wave control similar to that of FIGURE 1 is illustrated in FIGURE 3. This circuit provides a means of extending the life of the lamp 36 which is located to irradiate the active surface of light activated switch 31 and is used for phase control firing. Again, in this circuit the light activated switch 31 has a rheostat 34 connected between its anode and cathode terminals 32 and 33. Also, the rheostat is provided with a movable tap 35 and the firing lamp 36 is connected between the movable tap 35 and one of the light activated switch terminals (in this case cathode terminal 33).

In order to prevent current from flowing through the lamp 36 on both half cycles when an alternating voltage is applied between anode and cathode terminals 32 and 33, a rectifier 37 is connected in series with rheostat 34. Here the rectifier is connected between rheostat 34 and anode terminal 32 in such a manner that current can flow through it when the light activated switch anode terminal 32 is positive relative to its cathode terminal 33 but blocks current flow for the opposite polarity. In this location the rectifier is effectively in series with the lamp 36 and thus also passes and blocks current flow through the lamp 36 for opposite half-cycles as described. Consequently, the rectifier 37 allows current to flow through lamp 36 on the half-cycle when light activated switch 31 can conduct but blocks when light activated switch 31 cannot conduct. In this manner, the life of lamp 36 is extended to its maximum.

The circuit is energized from input terminals 38 and 39 which are intended to be connected to an alternating source. The cathode terminal 33 is connected directly to input terminal 39. Anode terminal 32 is connected to the opposite input terminal 38 through the load 40 which is connected between load terminals 41 and 42.

Figure 4:
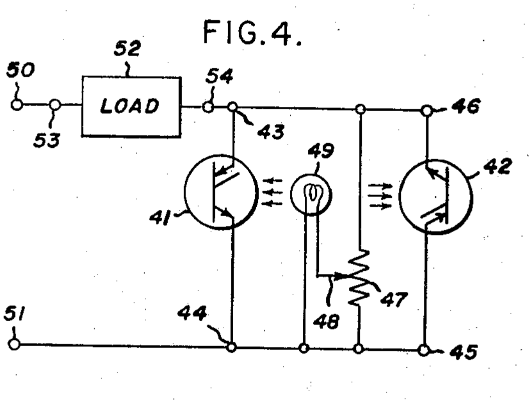
FIGURE 4 is a circuit diagram illustrating a full wave symmetrical circuit using two light activated switches with a common source of radiation.

The circuit of FIGURE 4 shows a full wave symmetrical circuit using two light activated switches 41 and 42 and a single lamp 49. One light activated switch 41 has its anode and cathode terminals 43 and 44 connected directly to the cathode and anode terminals 46 and 45 respectively of the other light activated switch 42. Thus, the light activated switches 41 and 42 are connected for conduction on opposite half-cycles of applied alternating voltage. A rheostat 47 having a movable tap 48 is connected directly between anode and cathode terminals of both light activated switches. Firing lamp 49 is connected between the movable tap 48 and the anode terminal 45 of light activated switch 42 so that each light activated switch (41 and 42) operates for one-half cycle of applied voltage just as the circuit of FIGURE 1 to provide phase control firing but each light activated switch operates on opposite half-cycles. This arrangement provides full wave phase control.

The alternating supply is provided between input terminals 50 and 51. Again, a load 52 to be controlled is connected between load terminals 53 and 54 which are in series circuit between one input terminal and the anode terminal 43 of one light activated switch. The other circuit input terminal 51 is connected directly to the cathode terminal 44 of light activated switch 41.

Figure 5:
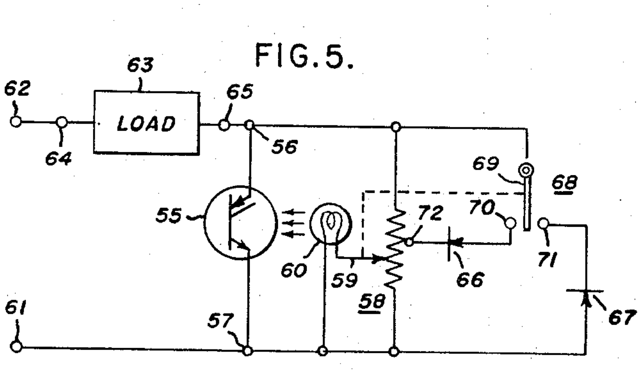
FIGURE 5 is a circuit diagram showing control circuit which provides phase control of one-half cycle of an alternating source with and without full conduction on the alternate half cycle.

FIGURE 5 illustrates a half-wave circuit for phase control firing of light activated switch 55 for one-half cycle with modifications to provide for full conduction (to the load) of the alternate half-cycle.

In order to provide for phase-control firing of light activated switch 55 for the half cycle when its anode terminal 56 is positive relative to its cathode terminal 57 a rheostat and lamp arrangement essentially as previously described is provided. That is, a rheostat 58 is connected between anode and cathode terminals 56 and 57. The rheostat is provided with an adjustable tap 59 and a lamp 60 is connected between the movable tap 59 and the cathode terminal 57. The lamp 60 is positioned to irradiate the active portion of light activated switch 55. As before, the light activated switch 55 is connected in series with a load 63 and its terminals 64 and 65 directly across input terminals 61 and 62 which are intended to be connected to a source of alternating voltage. The arrangement thus far described provides half-wave phase control in the manner previously described.

In order to provide the option of full conduction of the alternate half cycle along with phase control of one-half cycle two rectifiers 66 and 67 and a two-position switch 68 are added to the circuit and a center tap 72 is provided on rheostat 58.

The switch 68 is provided with a conductive arm 69 which is electrically connected to upper input terminal 62 through load 63. The switch arm 69 is interlocked with rheostat tap 59 so that when movable tap 59 is on the cathode terminal 57 side (below in the figure) of center tap switch arm 69 contacts its terminal 70 and when tap 59 passes over center tap 72 to the upper part of rheostat 58, the switch arm 69 moves over to its other terminal 71. Rectifier 66 is connected between switch terminal 70 and center tap 72 in such a manner that it conducts current from terminal 70 toward the center tap 72 and blocks current flow in the opposite direction.

Assume then that rheostat arm 59 is at the lower end of the rheostat 59 and switch arm 69 closed on its terminal 70. Light activated switch 55 is in condition to be triggered only for the half cycle of input voltage which is positive at upper input terminal 62 (and anode terminal 56) relative to lower input terminal 61. This potential we will call positive and the opposite half cycle we will call negative. The current path for the activating lamp is from upper input terminal through load 63, through switch arm 69, and switch terminal 70, through rectifier 66, the lower half of rheostat 58, movable tap 59, lamp 60 and back to lower input terminal 61. Rectifier 66 blocks the reverse current flow through this path. Rheostat 58 has a resistance such that either half in series with lamp 60 just keeps the radiation from the lamp 60 below the light activated switch threshold level. Consequently, the light activated switch does not fire. As movable tap 59 is moved up toward the center tap radiant energy from the lamp exceeds the threshold level earlier and earlier in the positive half-cycle of supply voltage until light activated switch conducts over the full half-cycle when movable tap 59 is just at the center tap 72. At this point, rheostat 58 does not provide resistance in the lamp current path just traced.

When movable tap 59 is moved just above center tap 72, interlocked switch arm 69 is moved away from terminal 70 and placed in contact with its other terminal 68. Thus, the lamp 60 is now placed in series with the resistance of the upper half of rheostat 58 so it is not energized by enough current to cause light activated switch 55 to fire for the positive half-cycle supply voltage. However, rectifier 67 is connected between lower input terminal 61 and upper input terminal in series with load 63 in such a manner that it conducts the negative half cycle. Thus, the load still receives a full half-cycle although it is no longer the positive half-cycle as conducted by light activated switch 55. As movable tap 59 is moved further up toward the top of rheostat 58, the radiation from lamp 60 exceeds the threshold level of light activated switch 55 earlier and earlier in the cycle until at the top it turns light activated switch 55 on for the full positive half-cycle. Thus, the load excitation is phase controlled over essentially the full 360 electrical degrees.

Although the invention and its operation has been described with reference to specific embodiments, the invention is not to be limited to these embodiments nor are the particular instrumentalities employed to be considered limiting. Many modifications will be obvious to those skilled in the art. It is thus intended in the appended claims to claim all such variations as fall within the true spirit and scope of the invention.

What I claim as new and desire to secure by Letters Patent of the United States is:

1. A phase control circuit for a light activated switch including a pair of supply terminals for connection to a source of pulsating voltage, a light activated switch having an anode and a cathode terminal, said anode and cathode terminals being coupled to said supply terminals whereby said light activated switch is energized by the said pulsating voltage source, said light activated switch having a threshold radiation level for firing and a low resistance when fired thereby presenting essentially a short circuit between said supply terminals when fired, a source of radiation located to irradiate said light activated switch, said source of radiation being coupled to said supply terminals whereby said source of radiation is energized by the said pulsating voltage source and de-energized when said light activated switch is fired, control means connected in circuit relation with said source of radiation and controlling the magnitude of the voltage applied to said source of radiation thereby controlling the intensity of said source of radiation and providing phase control firing of said light activated switch.

2. A phase control circuit for a light activated switch as defined in claim 1 wherein said source of radiation includes at least one incandescent lamp.

3. A phase control circuit for a light activated switch including a pair of supply terminals for connection to a source of pulsating voltage, a light activated switch having an anode and a cathode terminal, said anode and cathode terminals being coupled to said supply terminals whereby said light activated switch is energized by the said pulsating voltage source, said light activated switch having a threshold radiation level for firing and a low resistance when fired thereby presenting essentially a short circuit between said supply terminals when fired, a source of radiation located to irradiate said light activated switch, said source of radiation comprising at least one incandescent lamp electrically connected between the said anode and cathode terminals of said light activated switch, rheostat means connected in circuit relation with said incandescent lamp in a manner to determine the magnitude of voltage applied to said lamp from said source thereby controlling the intensity of radiation from said lamp and providing phase control firing of said light activated switch.

4. A phase control circuit for a light activated switch as defined in claim 3 wherein said rheostat means is connected in series with said incandescent lamp means across said light activated switch anode and cathode.

5. A phase control circuit for a light activated switch as defined in claim 3 wherein said rheostat is connected across the anode and cathode terminals of said light activated switch and said incandescent lamp is connected between the movable tap of said rheostat means and one of said anode and cathode terminals of said light activated switch.

6. A phase control circuit for a light activated switch as defined in claim 3 wherein a rectifier is connected in series circuit relationship with said incandescent lamp whereby current flows in only one direction through the said lamp.

7. A phase control circuit for said light activated switch as defined in claim 5 wherein a rectifier is connected in series circuit relationship with said incandescent lamp whereby current flows in only one direction through the said lamp.

8. In a phase control circuit for light activated switches including in combination a pair of supply terminals for connection to a source of pulsating voltage, a pair of light activated switches each having an anode and a cathode terminal and each having a low resistance when fired thereby presenting essentially a short circuit between anode and cathode terminals, a first one of said light activated switches having its anode and cathode terminals electrically connected to the cathode and anode terminals respectively of the second one of said light activated switches and to said pair of supply terminals whereby said light activated switches are energized by the pulsating voltage source, a source of radiation located to irradiate said light activated switches, said source of radiation being coupled to said supply terminals whereby said source of radiation is energized by the said pulsating voltage source and de-energized when either of said light activated switches is fired, control means connected in circuit relation with said source of radiation and controlling the magnitude of the voltage applied to said source of radiation thereby controlling the intensity of said source of radiation and providing phase control firing of said light activated switches.

9. A phase control circuit for light activated switches as defined in claim 8 wherein said source of radiation includes at least one incandescent lamp.

10. In a phase control circuit for light activated switches including in combination a pair of supply terminals for connection to a source of pulsating voltage, a pair of light activated switches each having an anode and a cathode terminal and each having a low resistance when fired thereby presenting essentially a short circuit between anode and cathode terminals, a first one of said light activated switches having its anode and cathode terminals electrically connected to the cathode and anode terminals respectively of the second one of said light activated switches and to said pair of supply terminals whereby said light activated switches are energized by the pulsating voltage source, a source of radiation located to irradiate said light activated switches, said source of radiation comprising at least one incandescent lamp electrically connected between anode and cathode terminals of said light activated switches, rheostat means connected in circuit relation with said incandescent lamp in a manner to determine the magnitude of voltage applied to said lamp from said source thereby controlling the intensity of radiation from said lamp and providing phase control firing of said light activated switches.

11. A phase control circuit for light activated switches as defined in claim 10 wherein said rheostat means is electrically connected between the anode and cathode terminals of said light activated switches and said lamp is connected between the movable tap of said rheostat means and the anode and cathode terminals respectively of said first and second light activated switches.

12. In a phase control circuit for a light activated switch, a full wave bridge rectifier having a pair of input terminals for connection to a source of alternating voltage and a pair of output terminals for supplying a unidirectional pulsating voltage, a light activated switch having an anode and cathode terminal and a low resistance when fired thereby presenting essentially a short circuit between anode and cathode terminals when fired, said anode and cathode terminals being connected to said output terminals in such a manner that the voltage applied is of the proper sense for conduction of said light activated switch, a source of radiation located to irradiate said light activated switch, said source of radiation being coupled to said output terminals whereby said source of radiation is energized by said unidirectional voltage, control means connected in circuit relation with said source of radiation and controlling the magnitude of the voltage applied to said source of radiation thereby controlling the intensity of radiation from said source of radiation and providing phase control firing of said light activated switch.

13. A phase control circuit for a light activated switch as defined in claim 12 wherein said source of radiation includes at least one incandescent lamp.

14. In a phase control circuit for a light activated switch, a full wave bridge rectifier having a pair of input terminals for connection to a source of alternating voltage and a pair of output terminals for supplying a unidirectional pulsating voltage, a light activated switch having an anode and cathode terminal and a low resistance when fired thereby presenting essentially a short circuit between said anode and cathode terminals, said anode and cathode terminals being connected to said output terminals in such a manner that the voltage applied is of the proper sense for conduction of said light activated swtich, a source of radiation located to irradiate said light activated switch, said source of radiation being coupled to said output terminals whereby said source of radiation is energized by said unidirectional voltage, rheostat means connected in circuit relation with said incandescent lamp in a manner to determine the magnitude of voltage applied to said lamp from said source thereby controlling the intensity of radiation from said lamp and providing phase control firing of said light activated switch.

15. A phase control circuit for a light activated switch as defined in claim 13 wherein said rheostat is connected across the anode and cathode terminals of said light activated switch and said incandescent lamp is connected between the movable tap of said rheostat means and one of said anode and cathode terminals of said light activated switch.

16. In combination in a phase control circuit for providing full wave control of the alternating voltage applied to a load including a light activated switch having an anode and cathode terminal and a low resistance when fired thereby presenting essentially a short circuit between said anode and cathode terminals, a pair of load terminals for connection to a load to be supplied, a pair of source terminals for connection to a source of alternating current, said anode and cathode terminals and said pair of load terminals being connected in series circuit relation across said supply terminals, said light activated switch blocking current flow for the half cycle of the source when its anode is negative relative to its cathode, a source of radiation located to irradiate said light activated switch, said source of radiation being connected in circuit relation across said source terminals and said light activated switch whereby said source of radiation is essentially short circuited when said light activated switch is conductive, control means in circuit relation with said source of radiation and controlling the magnitude of voltage applied to said source of radiation thereby rendering the intensity of said source of radiation a function of voltage half cycles from the alternating voltage source thereby providing phase control firing of said light activated switch and thereby control of the voltage applied to the load for the one half cycle from the voltage source which renders said light activated switch anode positive relative to its cathode, and means selectively to connect said load terminals in series circuit relation with said source terminals for the opposite half cycle thereby selectively to provide full and half wave phase control.

17. A phase control circuit as defined in claim 16 wherein said source of radiation includes at least one incandescent lamp.

18. In combination in a phase control circuit for providing full wave control of alternating voltage applied to a load including a light activated switch having an anode and cathode terminal, a pair of load terminals for connection to a load to be supplied, a pair of source terminals for connection to a source of alternating current, said anode and cathode terminals and said pair of load terminals being connected in series circuit relation across said supply terminals, said light activated switch blocking current flow for the half cycle of the source when its anode is negative relative to its cathode; a rheostat having two main terminals with its full resistance therebetween, an intermediate fixed tap, and a movable tap movable over substantially the entire resistance, said rheostat having its main terminals connected in parallel circuit relation with said anode and cathode terminals of said light activated switch; an incandescent lamp connected between said movable tap and a first one of said two main rheostat terminals, switch means having a main conductive pole and two switch terminals to which said pole can selectively be connected, said main conductive pole connected to the opposite one of said two main rheostat terminals, a first rectifier connected between a first one of said two switch terminals and said fixed tap on said rheostat said first rectifier connected to provide a conductive path through said lamp when positive voltage is applied to the anode of said light activated switch whereby half wave control is provided when said main arm of said switch is in contact with said first one of said two switch terminals, a second rectifier connected between said second one of said two switch terminals and the said first one of said two main rheostat terminals, said second rectifier connected to provide a conductive path between said first and second main rheostat terminals for negative voltage applied anode to cathode of said light activated switch.

19. A phase control circuit as defined in claim 18 wherein said movable tap of said rheostat and said main pole are interlocked so that the main pole of said switch is switched between the first and second switch terminals as the movable tap moves between said fixed tap thereby automatically to switch between half and full wave control.

References Cited

UNITED STATES PATENTS

| | | | |
|---|---|---|---|
| 2,984,749 | 4/1961 | Ross | 250—213 |
| 3,040,178 | 6/1962 | Lyman et al. | 250—213 |
| 3,136,926 | 6/1964 | Smith | 250—217 |

OTHER REFERENCES

"Vacuum Tube and Semiconductor Electronics," by Jacob Millman, McGraw-Hill, 1958, New York, p. 349.

ARCHIE R. BORCHELT, *Primary Examiner.*

RALPH G. NILSON, *Examiner.*

M. ABRAMSON, *Assistant Examiner.*